(12) United States Patent
Atesoglu

(10) Patent No.: US 9,065,449 B2
(45) Date of Patent: Jun. 23, 2015

(54) HIGH-SPEED DIVIDE-BY-1.5 CIRCUIT WITH 50 PERCENT DUTY CYCLE

(71) Applicant: Avago Technologies General IP (Singapore) Pte. Ltd., Singapore (SG)

(72) Inventor: Ali Atesoglu, Milpitas, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 25 days.

(21) Appl. No.: 14/064,247

(22) Filed: Oct. 28, 2013

(65) Prior Publication Data

US 2015/0116011 A1  Apr. 30, 2015

(51) Int. Cl.
*H03K 23/00* (2006.01)
*H03K 23/50* (2006.01)

(52) U.S. Cl.
CPC .................................. *H03K 23/505* (2013.01)

(58) Field of Classification Search
None
See application file for complete search history.

(56) References Cited

U.S. PATENT DOCUMENTS

| | | | | |
|---|---|---|---|---|
| 4,942,595 A | * | 7/1990 | Baca | 377/48 |
| 5,442,670 A | * | 8/1995 | Shu | 377/48 |
| 5,552,732 A | | 9/1996 | Huang | |
| 5,563,921 A | * | 10/1996 | Mesuda et al. | 375/376 |
| 6,150,855 A | * | 11/2000 | Marbot | 327/116 |
| 6,441,659 B1 | * | 8/2002 | Demone | 327/156 |
| 6,882,229 B1 | * | 4/2005 | Ho et al. | 331/1 A |
| 7,898,306 B1 | * | 3/2011 | Cheng | 327/156 |
| 8,558,589 B2 | * | 10/2013 | Dahan et al. | 327/115 |
| 2003/0064699 A1 | * | 4/2003 | Olsen | 455/318 |
| 2003/0092419 A1 | * | 5/2003 | Nobbe et al. | 455/324 |
| 2010/0039153 A1 | * | 2/2010 | Qiao et al. | 327/254 |
| 2012/0161824 A1 | * | 6/2012 | Tao et al. | 327/122 |
| 2013/0285722 A1 | * | 10/2013 | Chou | 327/157 |

OTHER PUBLICATIONS

Cole, A. "Silicon-Accurate Fractional-N PLL Design." Design and Reuse [online]. [retrieved on Oct. 17, 2013]. Retrieved from the Internet: <URL: http://www.design-reuse.com/articles/31440/silicon-accurate-fractional-n-pll-design.html>.

\* cited by examiner

*Primary Examiner* — Lincoln Donovan
*Assistant Examiner* — Khareem E Almo

(57) ABSTRACT

A divide-by-1.5 circuit includes a divide-by-3 circuit that and a frequency doubler circuit. The divide-by-3 circuit has few logic elements and provides glitch-free operation with a 50 percent duty cycle output. The frequency doubler circuit is based on phase-locked loop circuitry.

20 Claims, 6 Drawing Sheets

US 9,065,449 B2

HIGH-SPEED DIVIDE-BY-1.5 CIRCUIT WITH 50 PERCENT DUTY CYCLE

BACKGROUND

High-speed data transceivers commonly include frequency divider circuits that convert a higher frequency to a lower frequency, i.e., divide a higher frequency down to a lower frequency. Such frequency divider circuits are commonly known as "divide-by-X" circuits, where X is a number. Most commonly, X is an integer. However, "fractional divider" circuits, in which X is not an integer, are also known. For example, divide-by-1.5 circuits are known.

High-speed data transceivers can include several frequency divider circuits that divide by several corresponding values of X. For example, transceiver can include a divide-by-2 circuit and a divide-by-4 circuit and other such divide-by-X circuits. A multiplexer can be included that selects which of the frequency divider circuits is to be utilized in response to operating conditions.

Fractional divider circuits are commonly based upon phase-locked loop (PLL) circuitry and can be somewhat complex, especially if a 50 percent duty cycle is generated. Circuit complexity can undesirably contribute to power dissipation and consume area on an integrated circuit chip.

SUMMARY

Embodiments of the present invention relate to a divide-by-1.5 circuit that comprises a divide-by-3 circuit and a frequency doubler circuit. The divide-by-3 circuit has an input that can be coupled to a source of an input signal, i.e., the signal to be divided in frequency. The frequency doubler circuit comprises phase-locked loop circuitry and has an input coupled to an output of the divide-by-3 circuit and an output that defines the output of the divide-by-1.5 circuit.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 1:
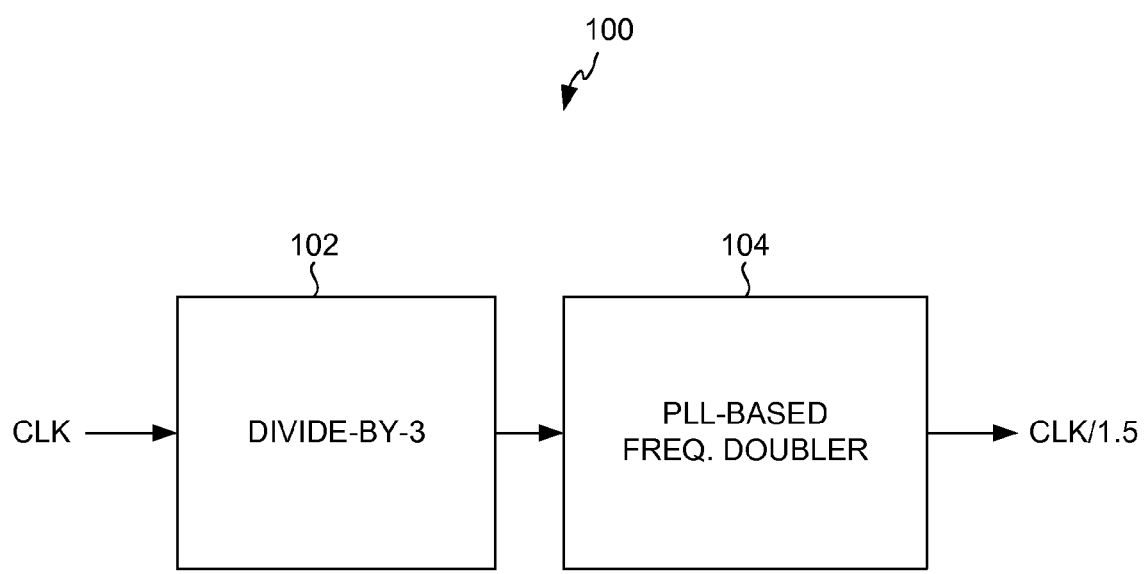
FIG. 1 is a block diagram of a divide-by-1.5 circuit in accordance with an exemplary embodiment of the invention.

As illustrated in FIG. 1, in an illustrative or exemplary embodiment of the invention, a divide-by-1.5 circuit 100 includes a divide-by-3 circuit 102 and a phase-locked loop (PLL)-based frequency doubler circuit 104. The output of divide-by-3 circuit 102 is coupled to the input of PLL-based frequency doubler circuit 104. Divide-by-1.5 circuit 100 receives an input clock signal (CLK) having a frequency f and generates an output clock signal (CLK/1.5) having a frequency f/1.5 and a 50 percent duty cycle.

Figure 2:
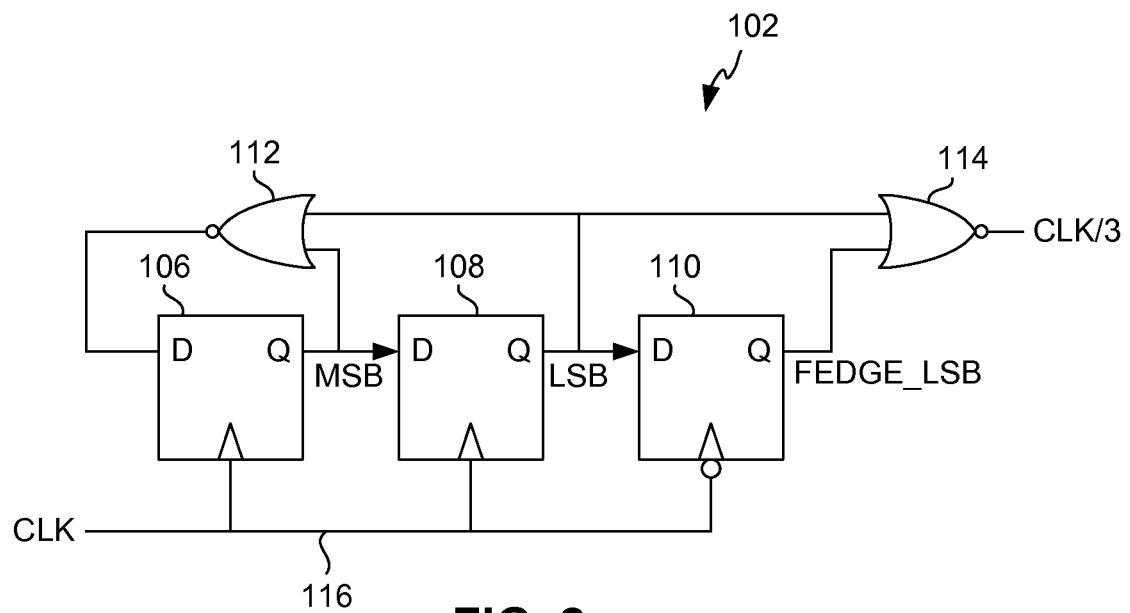
FIG. 2 is a block diagram of the divide-by-3 circuit of FIG. 1.

As illustrated in FIG. 2, divide-by-3 circuit 102 includes a first D flip-flop 106, a second D flip-flop 108, a third D flip-flop 110, a first NOR gate 112, and a second NOR gate 114. The clock input of first D flip-flop 106 is coupled to a circuit node 116 defining the input of divide-by-3 circuit 102 that receives the above-described input clock signal (CLK). The clock input of second D flip-flop 108 is similarly coupled to circuit node 116. The input (D) of second D flip-flop 108 is coupled to the output (Q) of first D flip-flop 106. The clock input of third D flip-flop 110 is inverted but similarly coupled to circuit node 116. The input (D) of third D flip-flop 110 is coupled to the output (Q) of second D flip-flop 108. The first input of first NOR gate 112 is coupled to the output (Q) of first D flip-flop 106. The second input of first NOR gate 112 is coupled to the output (Q) of second D-flip-flop 108. The output of first NOR gate 112 is coupled to the input (D) of first D flip-flop 106. The first input of second NOR gate 114 is coupled to the output of third D flip-flop 110. The second input of second NOR gate 114 is coupled to the output of the second D-flip-flop 108. The output of second NOR gate 114 defines the output of divide-by-3 circuit 102.

Figure 3:
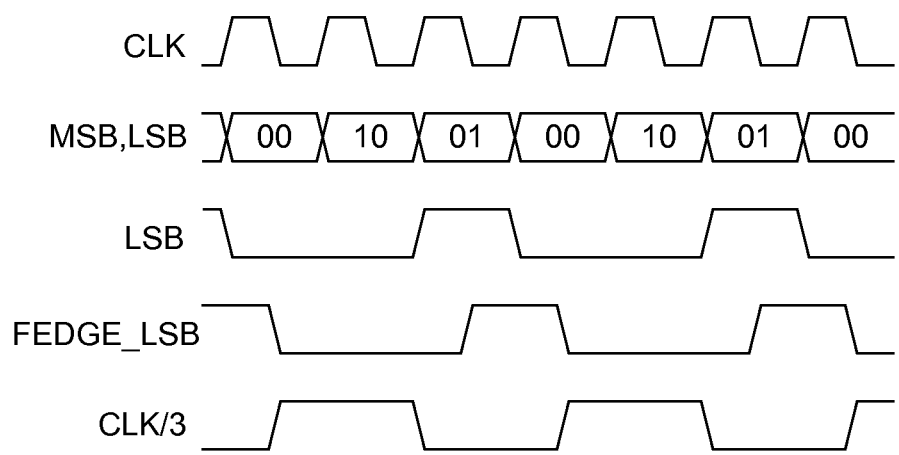
FIG. 3 is a timing diagram for the divide-by-3 circuit of FIG. 2.

As illustrated by the timing diagram of FIG. 3, the outputs of first and second flip-flops 106 and 108 define the most-significant bit (MSB) and least-significant bit (LSB), respectively, of a two-bit counter circuit that counts in response to the rising edge of the input clock signal (CLK). Third D flip-flop 110 receives the counter LSB and provides a output (FEDGE_LSB) representing the LSB in response to the falling edge of input clock signal (CLK). That is, the output of third D flip-flop 110 is the counter LSB delayed by a half clock cycle. Second NOR gate 114 combines the counter LSB with the delayed version of the LSB. Thus, the output (CLK/3) of divide-by-3 circuit 102 has a frequency of f/3 and a 50 percent duty cycle. It can be noted that divide-by-3 circuit 102 consists of relatively few elements, operates without logic glitches, and immediately enters a steady state of operation after being started up regardless of the initial states of logic elements.

Figure 4:
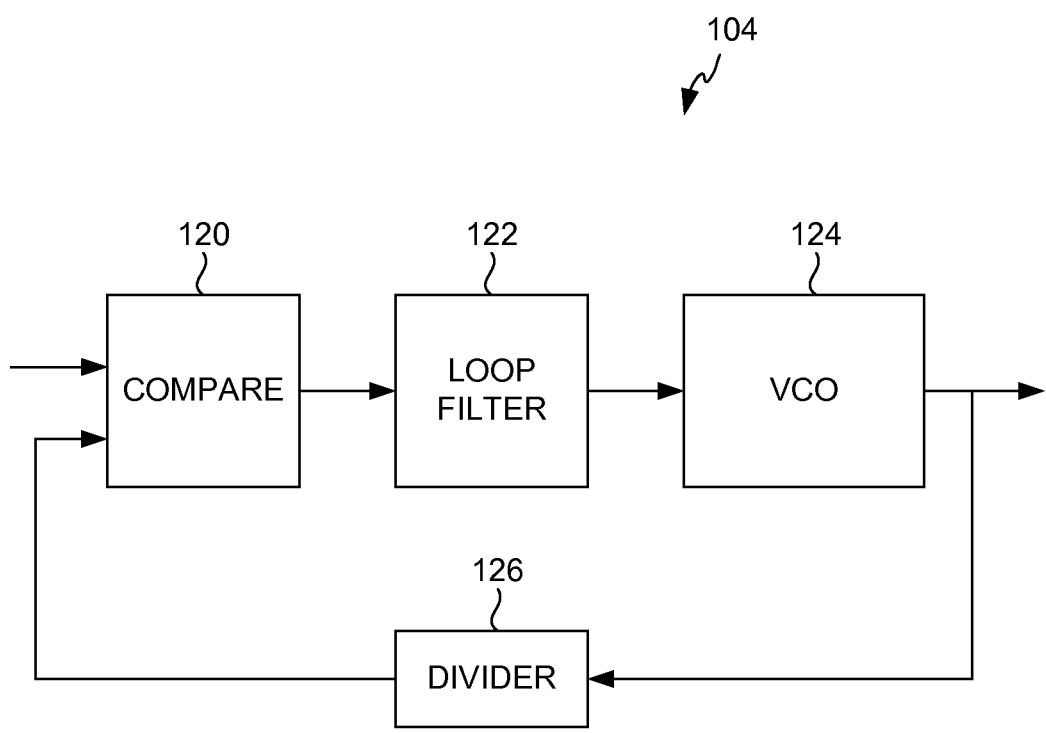
FIG. 4 is a block diagram of an exemplary frequency doubler circuit of the divide-by-1.5 circuit of FIG. 1.

As illustrated in FIG. 4, PLL-based frequency doubler circuit 104 includes a comparison circuit 120, a loop filter 122, a voltage-controlled oscillator (VCO) 124, and a loop divider circuit 126. Comparison circuit 120 compares the input of frequency doubler circuit 104 with a feedback loop signal provided by loop divider circuit 126. Loop divider circuit 126 receives the output of VCO 124. The output of comparison circuit 120 is coupled to the input of loop filter 122. The output of loop filter 122 is coupled to the input of VCO 124. The output of VCO 124 defines the output of PLL-based frequency doubler circuit 104.

Figure 5:
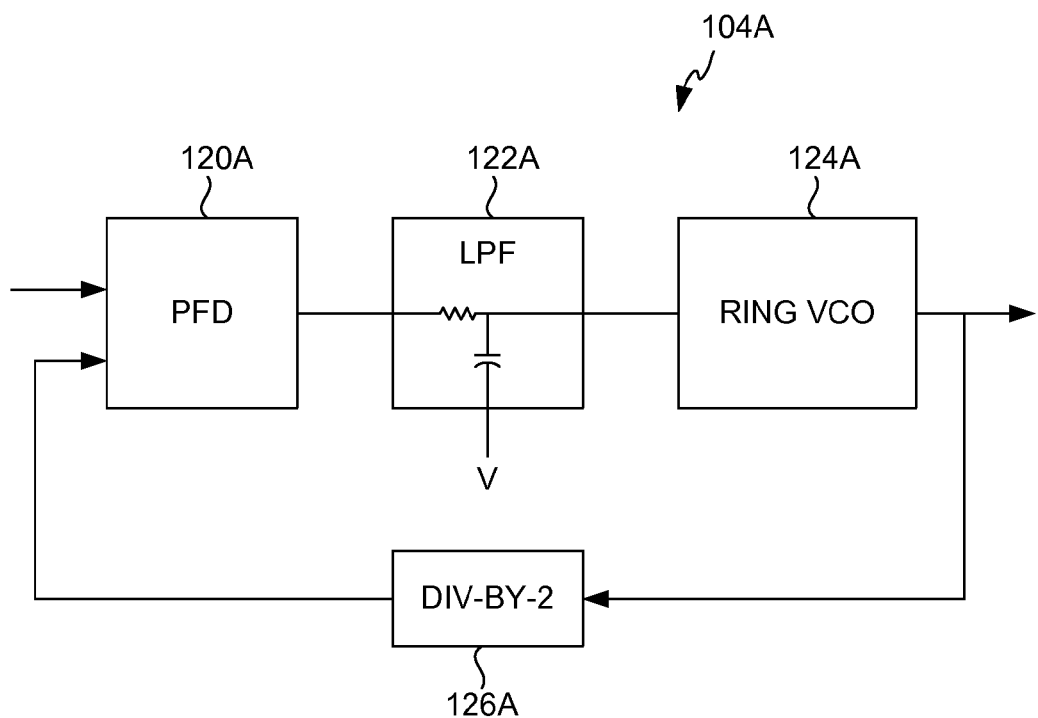
FIG. 5 is a block diagram of another exemplary frequency doubler circuit of the divide-by-1.5 circuit of FIG. 1.

As illustrated in FIG. 5, PLL-based frequency doubler circuit 104 (FIG. 4) can be embodied, for example, in the form of PLL-based frequency doubler circuit 104A. PLL-based frequency doubler circuit 104A includes a phase-frequency detector (PFD) 120A that serves as a comparison circuit, an RC low-pass filter 122A that serves as a loop filter, a ring VCO 124A, and a divide-by-2 circuit 126A that serves as a loop divider circuit. Divide-by-2 circuit 126A can consist of a single D flip-flop. The PFD 120A compares the input of frequency doubler circuit 104A with a feedback loop signal provided by divide-by-2 circuit 126A. Divide-by-2 circuit 126A receives the output of ring VCO 124A. The output of PFD 120A is coupled to the input of RC low-pass filter 122A. The output of RC low-pass filter 122A is coupled to the input of ring VCO 124A. In operation, the output of PFD 120A is filtered and adjusts the VCO frequency up or down until the two inputs of PFD 120A are in phase with each other. When the two inputs of PFD 120A are in phase with each other, ring VCO 124A outputs a signal having a frequency twice the frequency of the signal provided as the input of PLL-based frequency doubler circuit 104A. The output of ring VCO 124A defines the output of PLL-based frequency doubler circuit 104A.

Figure 6:
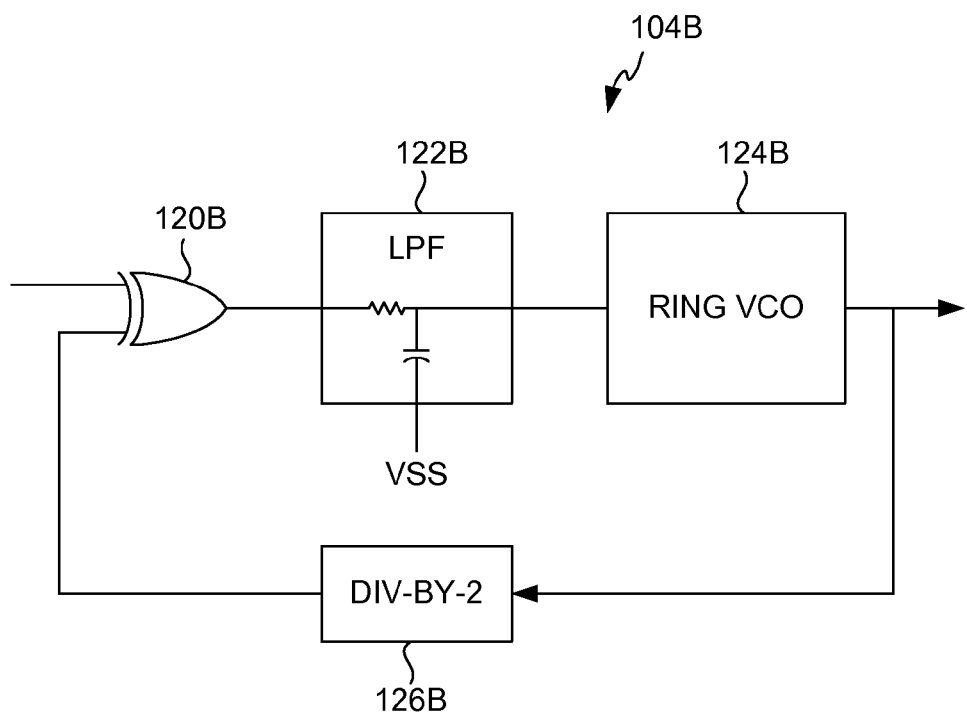
FIG. 6 is a block diagram of a yet another exemplary frequency doubler circuit of the divide-by-1.5 circuit of FIG. 1.

As illustrated in FIG. 6, PLL-based frequency doubler circuit 104 (FIG. 4) alternatively can be embodied, for example, in the form of PLL-based frequency doubler circuit 104B. PLL-based frequency doubler circuit 104B includes an exclusive-OR (XOR) gate 120B that serves as a comparison circuit, an RC low-pass filter 122B that serves as a loop filter, a ring VCO 124B, and a divide-by-2 circuit 126B that serves as a loop divider circuit. Divide-by-2 circuit 126B can consist of a single D flip-flop. The XOR gate 120B compares the input of frequency doubler circuit 104B with a feedback loop signal provided by divide-by-2 circuit 126B. Divide-by-2 circuit 126B receives the output of ring VCO 124B. The output of XOR 120B is coupled to the input of RC low-pass filter 122B. The output of RC low-pass filter 122B is coupled to the input of ring VCO 124B. In operation, the output of XOR gate 120B is filtered and adjusts the VCO frequency up or down until the two inputs of XOR gate 120B are in phase with each other. When the two inputs of XOR gate 120B are in phase with each other, ring VCO 124B outputs a signal having a frequency twice the frequency of the signal provided as the input of PLL-based frequency doubler circuit 104B. The output of ring VCO 124B defines the output of PLL-based frequency doubler circuit 104B.

Figure 7:
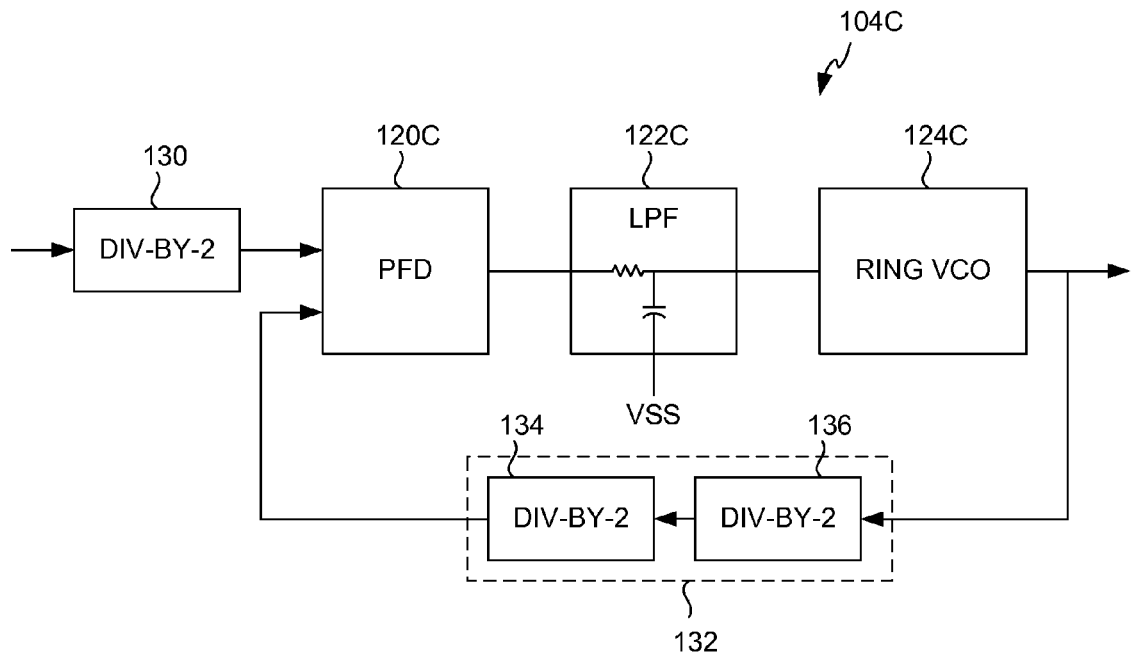
FIG. 7 is a block diagram of a still another exemplary frequency doubler circuit of the divide-by-1.5 circuit of FIG. 1.

As illustrated in FIG. 7, PLL-based frequency doubler circuit 104 (FIG. 4) alternatively can be embodied, for example, in the form of PLL-based frequency doubler circuit 104C. PLL-based frequency doubler circuit 104C includes a pre-divide-by-two circuit 130, a phase-frequency detector (PFD) 120C that serves as a comparison circuit, an RC low-pass filter 122C that serves as a loop filter, a ring VCO 124C, and a loop divide-by-4 circuit 132 that serves as a loop divider circuit. The inclusion of pre-divide-by-two circuit 130 and loop divide-by-four circuit 132 promotes the use of economical semiconductor fabrication technologies, such as CMOS, for fabricating PFD 120C, since such a PFD 120C need not be operable above operating frequencies that are characteristic of such fabrication technologies. Note that PFD 120C operates at half the frequency at which PFD 120A (FIG. 5) operates. Pre-divide-by-two circuit 130 defines the input of PLL-based frequency doubler circuit 104C. The output of pre-divide-by-2 circuit 130 is coupled to the input of PFD 120C. The PFD 120C compares the output of pre-divide-by-2 circuit 130 with a feedback loop signal provided by loop divide-by-4 circuit 132. Loop divide-by-4 circuit 132, in turn, receives the output of ring VCO 124C. The output of PFD 120C is coupled to the input of RC low-pass filter 122C. The output of RC low-pass filter 122C is coupled to the input of ring VCO 124C. Loop divide-by-4 circuit 132 can consist of two divide-by-2 circuits 134 and 136 in series with each other. Each of divide-by-2 circuits 130, 134 and 136 can consist of a single D flip-flop. In operation, the output of PFD 120C is filtered and adjusts the VCO frequency up or down until the two inputs of PFD 120C are in phase with each other. When the two inputs of PFD 120C are in phase with each other, ring VCO 124C outputs a signal having a frequency twice the frequency of the signal provided as the input of PLL-based frequency doubler circuit 104C. The output of ring VCO 124C defines the output of PLL-based frequency doubler circuit 104C.

Figure 8:
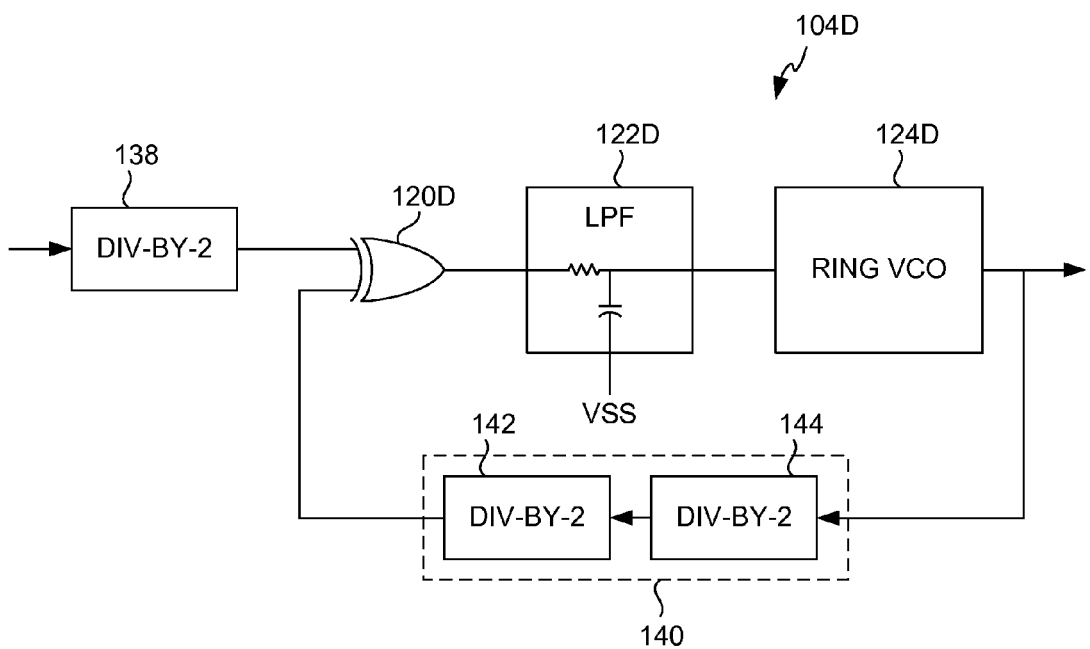
FIG. 8 is a block diagram of a further exemplary frequency doubler circuit of the divide-by-1.5 circuit of FIG. 1.

As illustrated in FIG. 8, PLL-based frequency doubler circuit 104 (FIG. 4) alternatively can be embodied, for example, in the form of PLL-based frequency doubler circuit 104D. PLL-based frequency doubler circuit 104D includes a pre-divide-by-two circuit 138, an XOR gate 120D that serves as a comparison circuit, an RC low-pass filter 122D that serves as a loop filter, a ring VCO 124D, and a loop divide-by-4 circuit 140 that serves as a loop divider circuit. Pre-divide-by-two circuit 138 defines the input of PLL-based frequency doubler circuit 104D. The output of pre-divide-by-2 circuit 138 is coupled to the input of XOR gate 120D. The XOR gate 120D compares the output of pre-divide-by-2 circuit 138 with a feedback loop signal provided by loop divide-by-4 circuit 140. Loop divide-by-4 circuit 140 receives the output of ring VCO 124D. The output of XOR gate 120D is coupled to the input of RC low-pass filter 122D. The output of RC low-pass filter 122D is coupled to the input of ring VCO 124D. Loop divide-by-4 circuit 140 can consist of two divide-by-2 circuits 142 and 144 in series with each other. Each of divide-by-2 circuits 138, 142 and 144 can consist of a single D flip-flop. In operation, the output of XOR gate 120D is filtered and adjusts the VCO frequency up or down until the two inputs of XOR gate 120D are in phase with each other. When the two inputs of XOR gate 120D are in phase with each other, ring VCO 124D outputs a signal having a frequency twice the frequency of the signal provided as the input of PLL-based frequency doubler circuit 104D. The output of ring VCO 124D defines the output of PLL-based frequency doubler circuit 104D.

Figure 9:
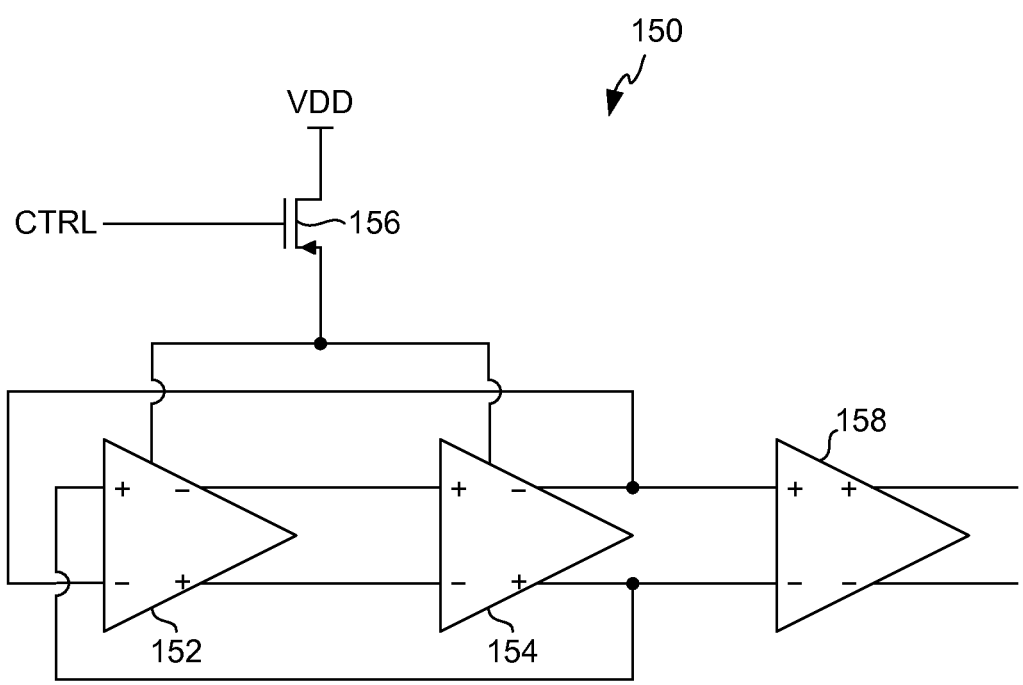
FIG. 9 is a block diagram of a ring VCO.

As illustrated in FIG. 9, any of ring VCOs 124A-124D can be embodied in the form of a ring VCO 150. Ring VCO 150 receives an input signal (CTRL) that controls the gain of two cross-coupled inverters 152 and 154 through a PFET 156. The output of inverter 154 is coupled to the input of a buffer 158. The output of buffer 158 defines the output of ring VCO 150.

One or more illustrative embodiments of the invention have been described above. However, it is to be understood that the invention is defined by the appended claims and is not limited to the specific embodiments described.

What is claimed is:
1. A divide-by-1.5 circuit, comprising:
a divide-by-3 circuit having an input coupleable to a source of an input signal; and
a frequency doubler circuit comprising phase-locked loop (PLL) circuitry, the frequency doubler circuit having an input coupled to an output of the divide-by-3 circuit and having an output defining an output of the divide-by-1.5 circuit, the PLL circuitry having a comparison circuit, a loop filter, a voltage-controlled oscillator (VCO), and a loop divider circuit, the comparison circuit having a first input defining the input of the frequency doubler circuit, the loop divider circuit having an input coupled to an output of the VCO and an output coupled to a second input of the comparison circuit, an output of the VCO defining an output of the frequency doubler circuit, the loop filter connected to an output of the comparison circuit and an input of the VCO, the frequency doubler circuit coupled to a pre-divide-by-2 circuit having an output coupled to the first input of the comparison circuit, wherein the loop divider circuit comprises a loop divide-by-4 circuit including two loop divide-by-2 circuits in series with each other, and wherein each of the two loop divide-by-2 circuits consists of a D flip-flop.

2. The divide-by-1.5 circuit of claim 1, wherein the divide-by-3 circuit comprises:
a first D flip-flop having a non-inverted clock input coupled to a node defining the input of the divide-by-3 circuit;
a second D flip-flop having a non-inverted clock input coupled to the node defining the input of the divide-by-3 circuit and having an input coupled to an output of the first D flip-flop;
a third D flip-flop having an inverted clock input coupled to the node defining the input of the divide-by-3 circuit and having an input coupled to an output of the second D flip-flop;
a first NOR gate having a first input coupled to the output of the first D flip-flop, a second input coupled to the output of the second D-flip-flop, and an output coupled to a D input of the first D flip-flop; and
a second NOR gate having a first input coupled to an output of the third D flip-flop, a second input coupled to the output of the second D-flip-flop, and an output defining the output of the divide-by-3 circuit.

3. The divide-by-1.5 circuit of claim 1, wherein the comparison circuit of the PLL circuitry comprises a phase-frequency detector (PFD).

4. The divide-by-1.5 circuit of claim 1, wherein the VCO of the PLL circuitry comprises a ring VCO.

5. The divide-by-1.5 circuit of claim 4, wherein the ring VCO of the PLL circuitry comprises a pair of cross-coupled inverters.

6. The divide-by-1.5 circuit of claim 1, wherein the comparison circuit of the PLL circuitry comprises an exclusive-OR (XOR) gate.

7. The divide-by-1.5 circuit of claim 1, wherein the loop filter of the PLL circuitry comprises a resistance and a capacitance.

8. A divide-by-1.5 circuit, comprising:
a divide-by-3 circuit having an input coupleable to a source of an input signal, the divide-by-3 circuit comprising: a first D flip-flop having a non-inverted clock input coupled to a node defining the input of the divide-by-3 circuit; a second D flip-flop having a non-inverted clock input coupled to the node defining the input of the divide-by-3 circuit and having an input coupled to an output of the first D flip-flop; a third D flip-flop having an inverted clock input coupled to the node defining the input of the divide-by-3 circuit and having an input coupled to an output of the second D flip-flop; a first NOR gate having a first input coupled to the output of the first D flip-flop, a second input coupled to the output of the second D-flip-flop, and an output coupled to a D input of the first D flip-flop; and a second NOR gate having a first input coupled to an output of the third D flip-flop, a second input coupled to the output of the second D-flip-flop, and an output defining the output of the divide-by-3 circuit; and a frequency doubler circuit comprising phase-locked loop (PLL) circuitry, the frequency doubler circuit having an input coupled to an output of the divide-by-3 circuit and having an output defining an output of the divide-by-1.5 circuit, the PLL circuitry comprising a comparison circuit, a loop filter, a voltage-controlled oscillator (VCO), and a loop divider circuit, the comparison circuit having a first input defining the input of the frequency doubler circuit, the loop divider circuit having an input coupled to an output of the VCO and an output coupled to a second input of the comparison circuit, an output of the VCO defining an output of the frequency doubler circuit, the loop filter coupled to a node connected to an output of the comparison circuit and an input of the VCO, wherein the frequency doubler circuit comprises a pre-divide-by-2 circuit having an output coupled to the first input of the comparison circuit, the loop divider circuit including a loop divide-by-4 circuit having two loop divide-by-2 circuits in series with each other, and wherein each of the two loop divide-by-2 circuits consists of a D flip-flop.

9. The divide-by-1.5 circuit of claim 8, wherein the comparison circuit of the PLL circuitry comprises a phase-frequency detector (PFD).

10. The divide-by-1.5 circuit of claim 8, wherein the VCO of the PLL circuitry comprises a ring VCO.

11. The divide-by-1.5 circuit of claim 10, wherein the ring VCO of the PLL circuitry comprises a pair of cross-coupled inverters.

12. The divide-by-1.5 circuit of claim 8, wherein the comparison circuit of the PLL circuitry comprises an exclusive-OR (XOR) gate.

13. The divide-by-1.5 circuit of claim 8, wherein the loop filter of the PLL circuitry comprises a resistance and a capacitance.

14. The divide-by-1.5 circuit of claim 1, wherein the divide-by-1.5 circuit receives a time-varying signal having a frequency f and generates an output signal having a frequency f/1.5.

15. The divide-by-1.5 circuit of claim 1, wherein the divide-by-1.5 circuit receives a time-varying signal and generates an output signal with a 50 percent duty cycle.

16. The divide-by-1.5 circuit of claim 1, wherein the divide-by-3 circuit comprises a two-bit counter.

17. The divide-by-1.5 circuit of claim 16, wherein the two-bit counter is responsive to a rising edge of a time-varying input signal.

18. The divide-by-1.5 circuit of claim 16, wherein the two-bit counter generates a least significant bit and a most significant bit, and wherein the output of the divide-by-3 circuit represents a delayed version of the least significant bit.

19. The divide-by-1.5 circuit of claim 1, wherein the comparison circuit is a phase-frequency detector.

20. The divide-by-1.5 circuit of claim 19, wherein the comparison circuit includes elements fabricated using at least one complementary metal-oxide-semiconductor technology.

* * * * *